(12) United States Patent
Motohara

(10) Patent No.: US 9,435,925 B2
(45) Date of Patent: Sep. 6, 2016

(54) OPTICAL FIBER CABLE CONNECTING STRUCTURE

(71) Applicant: OLYMPUS CORPORATION, Tokyo (JP)

(72) Inventor: Hiroyuki Motohara, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/571,986

(22) Filed: Dec. 16, 2014

(65) Prior Publication Data

US 2015/0098237 A1 Apr. 9, 2015

Related U.S. Application Data

(63) Continuation of application No. PCT/JP2013/063069, filed on May 9, 2013.

(30) Foreign Application Priority Data

Jun. 29, 2012 (JP) ................... 2012-147365

(51) Int. Cl.
| | |
|---|---|
| *F21V 8/00* | (2006.01) |
| *G02B 6/42* | (2006.01) |
| *H01S 5/022* | (2006.01) |
| *H01S 5/183* | (2006.01) |

(52) U.S. Cl.
CPC ........... *G02B 6/0006* (2013.01); *G02B 6/4202* (2013.01); *G02B 6/423* (2013.01); *H01S 5/02284* (2013.01); *H01S 5/183* (2013.01)

(58) Field of Classification Search
CPC .. G02B 6/0006; G02B 6/4202; G02B 6/423; H01S 5/02284; H01S 5/183
See application file for complete search history.

(56) References Cited

U.S. PATENT DOCUMENTS 5,247,597 A 9/1993 Blacha et al.
(Continued)

FOREIGN PATENT DOCUMENTS

| JP | 62129517 U | 8/1987 |
|---|---|---|
| JP | 06011632 A | 1/1994 |
| JP | 11023914 A | 1/1999 |

(Continued)

OTHER PUBLICATIONS

International Search Report dated Aug. 13, 2013 received in PCT/JP2013/063069.

*Primary Examiner* — Thomas M Sember
(74) *Attorney, Agent, or Firm* — Scully, Scott, Murphy & Presser, PC

(57) ABSTRACT

An optical fiber cable connecting structure includes: a substrate having a through hole; an optical element on a first surface of the substrate and having a light emitting unit such that the light emitting unit faces the substrate; an optical fiber cable on a second surface of the substrate opposite to the first surface, an end face of the optical fiber cable on a substrate side being covered with a jacket; a guide positioning part that has an insertion hole into which the optical fiber cable is inserted, and is configured to position the optical fiber cable and the optical element; and an abutting part that has a taper-shaped opening and is configured to position the optical element and the optical fiber cable so as to be separated by a specified distance by fixing an outer periphery of the end face of the optical fiber cable by the opening.

4 Claims, 2 Drawing Sheets

(56) References Cited

U.S. PATENT DOCUMENTS

| | | |
|---|---|---|
| 6,023,546 A | 2/2000 | Tachigori |
| 8,333,517 B2 | 12/2012 | Tanobe et al. |
| 2001/0022370 A1 | 9/2001 | Meyer-Guldner |
| 2013/0182099 A1 | 7/2013 | Nakamura |

FOREIGN PATENT DOCUMENTS

| | | |
|---|---|---|
| JP | 2001201672 A | 7/2001 |
| JP | 2003140008 A | 5/2003 |
| JP | 2007232888 A | 9/2007 |
| JP | 2011091332 A | 5/2011 |
| JP | 2012079851 A | 4/2012 |
| WO | 2008096716 A1 | 8/2008 |

OPTICAL FIBER CABLE CONNECTING STRUCTURE

CROSS REFERENCES TO RELATED APPLICATIONS

This application is a continuation of PCT international application Ser. No. PCT/JP2013/063069 filed on May 9, 2013 which designates the United States, incorporated herein by reference, and which claims the benefit of priority from Japanese Patent Application No. 2012-147365, filed on Jun. 29, 2012, incorporated herein by reference.

BACKGROUND

1. Technical Field

The disclosure relates to an optical fiber cable connecting structure.

2. Related Art

An optical fiber cable connecting structure is disclosed as a connecting structure for optical fiber cables in which an optical element is connected to an optical fiber cable using an insertion hole into which an optical fiber is inserted and a connecting fitting with a protecting jacket fitting groove provided therein (see, for example, Japanese Patent Application Laid-open No. 2007-232888).

SUMMARY

In some embodiments, an optical fiber cable connecting structure includes: a substrate having a through hole; an optical element mounted on a first surface of the substrate and having a light receiving unit for inputting an optical signal or a light emitting unit for outputting the optical signal, the light receiving unit or the light emitting unit being provided to face the substrate; an optical fiber cable mounted on a second surface of the substrate opposite to the first surface on which the optical element is mounted, an end face of the optical fiber cable on a substrate side being covered with a jacket; a guide positioning part that has an insertion hole into which the optical fiber cable is configured to be inserted to hold the optical fiber cable, the guide positioning part being configured to position the optical fiber cable with respect to an emitting direction of light that is input and output via the through hole from the optical element; and an abutting part that has an opening whose cross-sectional area on an optical fiber cable side is larger than that of the end face of the optical fiber cable and is reduced either stepwise or continuously towards the optical element, the abutting part being configured to position the optical element and the optical fiber cable so as to be separated by a specified distance by fixing an outer periphery of the end face of the optical fiber cable by the opening.

The above and other features, advantages and technical and industrial significance of this invention will be better understood by reading the following detailed description of presently preferred embodiments of the invention, when considered in connection with the accompanying drawings.

DETAILED DESCRIPTION

Modes for carrying out the invention (hereinafter referred to as "embodiments") will be described with reference to the accompanying drawings. The present invention is not limited to the embodiments. The same reference signs are used to designate the same elements throughout the drawings. The drawings are schematic and the relationship between the thickness and the width of the members, the proportion of the members, and the like may be different from reality. The dimension and the proportion are in some portions different between the drawings.

First Embodiment

Figure 1:
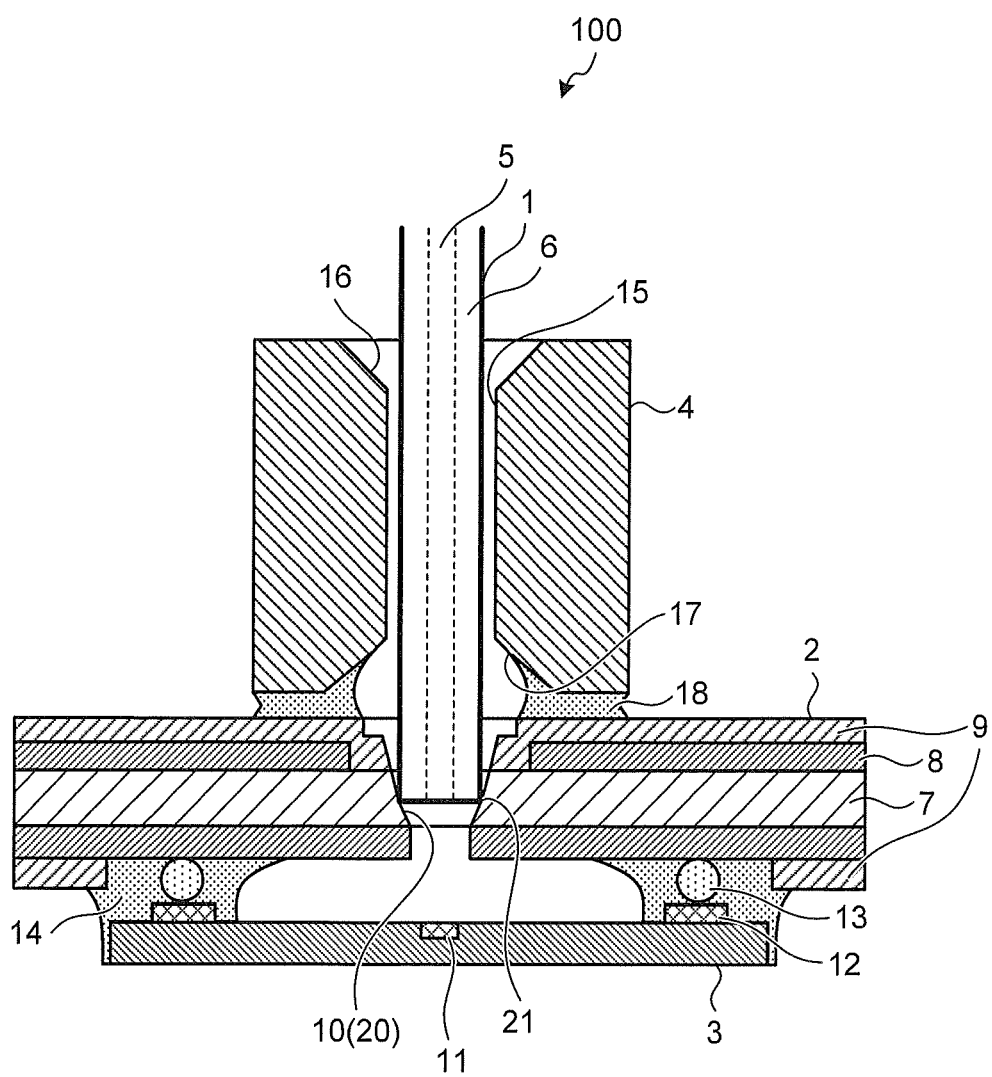
FIG. 1 is a cross-sectional view of an optical fiber cable connecting structure according to a first embodiment of the present invention.

FIG. 1 is a cross-sectional view of an optical fiber cable connecting structure according to a first embodiment of the present invention. An optical fiber cable connecting structure 100 according to the first embodiment of the present invention includes an optical fiber cable 1 that transmits an optical signal, a substrate 2, a surface emitting laser 3 as an optical element, and a guide positioning part 4 that holds the optical fiber cable 1.

The optical fiber cable 1 includes an optical fiber 5 that transmits an optical signal, and a jacket 6 that covers the optical fiber 5. The optical fiber 5 includes a core and a cladding, and an optical fiber having a core diameter $\phi$ 50 to 60 μm and a cladding outer diameter $\phi$ of 90 to 125 μm is suitable. The jacket 6 is formed of a material such as a polyimide or an acrylic resin, and the thickness of the jacket is 10 μm in a thin type and is not less than 400 μm in a thick type.

The substrate 2 includes a base member 7, a metal wiring layer 8 provided on the base member 7, and an insulating layer 9. The base member 7 has a plate shape and is formed of a polyimide, for example. The insulating layer 9 is formed of a resist or the like. A through hole 10 is formed in the substrate 2, and an optical signal output via the through hole 10 from the surface emitting laser 3 that will be described later is transmitted to the optical fiber cable 1.

In the first embodiment, the through hole 10 functions as an abutting part 20. The through hole 10 (abutting part 20) is provided such that an cross-sectional area of an opening on the optical fiber cable 1 side is larger than the cross-sectional area of the end face of the optical fiber cable 1 covered with the jacket 6. Further, the through hole 10 (abutting part 20) is provided such that the cross-sectional area of the opening is reduced stepwise or continuously towards the surface emitting laser 3. The through hole 10 (abutting part 20) is formed using a laser or a drill with a taper formed therein. In the through hole 10 (abutting part 20), preferably, the cross-sectional area of the opening is continuously reduced, and the sectional shape may be, for example, circular or rectangular. The through hole 10 (abutting part 20) preferably has a truncated cone shape.

In the through hole 10 (abutting part 20), since the cross-sectional area of the opening on the optical fiber cable 1 side is larger than the cross-sectional area of the end face of the optical fiber cable 1 while the cross-sectional area of the opening on the surface emitting laser 3 side is smaller than the cross-sectional area of the end face of the optical fiber cable 1, the outer periphery of the end face of the optical fiber cable 1 abuts on the inside of the through hole 10 for fixation, and the surface emitting laser 3 and the optical fiber cable 1 can be positioned so as to be separated by a specified distance. From the standpoint of light collection, the surface emitting laser 3 is preferably close to the optical fiber cable 1, and, thus, abutting on the outer periphery of an end face 21 of the optical fiber cable on the surface of the base member 7 is preferable. Alternatively, the abutting may be achieved on the interface between the base member 7 and the metal wiring layer 8 (on the optical fiber cable 1 side) or on the surface of the insulating layer 9 on the optical fiber cable 1 side.

The surface emitting laser 3 includes a light emitting unit 11 that outputs an optical signal. The light emitting unit 11 is mounted so as to face the substrate 2. A metal wiring layer 12 is provided on the surface emitting laser 3 on the mounting surface side and is mounted by flip-chip mounting on the substrate 2, for example, by ultrasonic joining through a bump 13 of Au (gold) or the like provided on the metal wiring layer 12. The joint strength can be increased by pouring from the side of the surface emitting laser 3 adhesive 14 such as an underfilling agent or a side filling agent and curing the adhesive 14. In the first embodiment, since the cross-sectional area of the opening of the through hole 10 (abutting part 20) on the surface emitting laser 3 side is small, the adhesive 14 is less likely to flow into the through hole 10 and, thus, the blocking of light transmission by the flow of the adhesive can be prevented.

The guide positioning part 4 has an insertion hole 15 for the insertion of the optical fiber cable 1. The surface emitting laser 3 and the optical fiber cable 1 can be positioned by inserting the optical fiber cable 1 into the insertion hole 15 and holding the optical fiber cable 1 in the insertion hole 15. Tapers 16 and 17 are provided in the insertion hole 15 on the optical fiber cable 1 insertion side and on the substrate 2 side, respectively. Since the taper 16 is formed on the optical fiber cable 1 insertion side, the optical fiber cable 1 can easily be inserted into the insertion hole 15. Further, the adhesive is supplied into the taper 16 to join the optical fiber cable 1 to the guide positioning part 4, and, thus, the area of joining between the guide positioning part 4 and the optical fiber cable 1 can be increased, contributing to an improved joint strength. Further, since the taper 17 is formed on the substrate 2 side, the flow of adhesive 18 for joining between the guide positioning part 4 and the substrate 2 into the insertion hole 15 or the through hole 10 can be prevented. When the adhesive 18 flows into the insertion hole 15 or the through hole 10 and is cured, a problem is likely to occur that the optical fiber cable 1 cannot be inserted into the through hole 10. The taper 16 can avoid this problem.

The guide positioning part 4 is jointed to the substrate 2 by coating the substrate 2 with the adhesive 18 and mounting the guide positioning part 4, for example, by a bonder. After mounting, the adhesive 18 is cured by UV or heat for curing to mount the guide positioning part 4 to the substrate.

In the optical fiber cable 1 in which the end face has been previously cut to expose the end face of the optical fiber 5, the end face of the optical fiber 5 is on the same plane as the end face of the jacket 6, and the optical fiber cable 1 is inserted into the insertion hole 15 through the taper 17 of the guide positioning part 4. The outer periphery of the optical fiber cable 1 abuts on the through hole 10 (abutting part 20) for positioning, followed by fixation, for example, with adhesive inserted into the taper 17. The optical fiber cable 1 abuts on the through hole 10 (abutting part 20) via the jacket 6, and, thus, damage to the optical fiber 5 can be prevented. Since the through hole 10 (abutting part 20) is tapered (a truncated cone) or the like, the end face of the optical fiber 5 can easily be positioned at a specified position. Further, the guide positioning part 4 is mounted on the substrate 2 (surface emitting laser 3), for example, with a bonder while positioning, and, thus, the optical fiber 5 can also easily be positioned in XY direction of the optical fiber 5.

In the first embodiment, a connecting structure between the surface emitting laser 3 and the optical fiber cable 1 has been described. This can be applied to a connecting structure between a light receiving element such as a photodiode and the optical fiber cable, and the same effect can be attained. The substrate 2 is also not limited to the above-described substrate 2 as long as the substrate has the through hole 10 (abutting part 20) as described above and the surface emitting laser 3 and the optical fiber cable 1 can be positioned in a simple and accurate manner.

Second Embodiment

Figure 2:
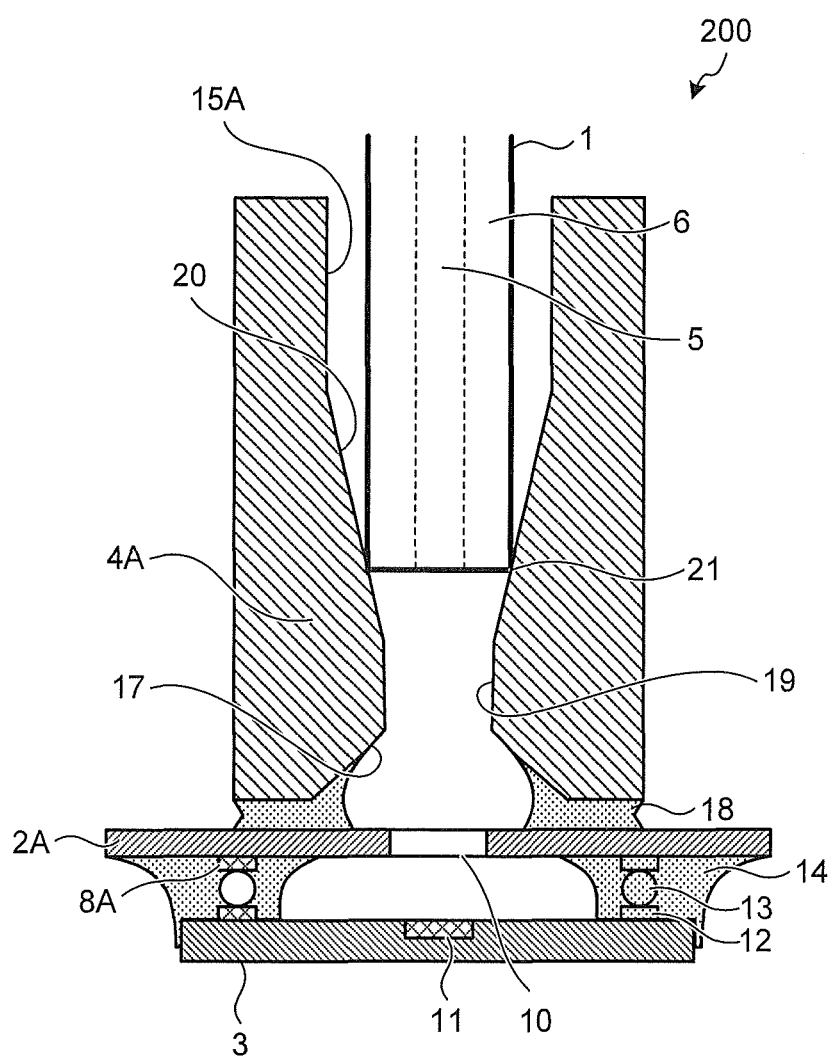
FIG. 2 is a cross-sectional view of an optical fiber cable connecting structure according to a second embodiment of the present invention.

FIG. 2 is a cross-sectional view of an optical fiber cable connecting structure according to a second embodiment of the present invention.

An optical fiber cable connecting structure 200 according to the second embodiment of the present invention is different from the optical fiber cable connecting structure 100 in the first embodiment of the present invention in that the abutting part 20 is provided within a guide positioning part 4A.

In the second embodiment, the abutting part 20 is tapered in an insertion hole 15A on a surface emitting laser 3 side. In the abutting part 20, the cross-sectional area of the opening on an optical fiber cable 1 side, that is, the cross-sectional area of the opening of the insertion hole 15A, is larger than the cross-sectional area of the end face of the optical fiber cable 1, and the cross-sectional area of the opening on the surface emitting laser 3 side is smaller than the cross-sectional area of the end face of the optical fiber cable 1. A through hole 19 having the same shape as the sectional shape of the abutting part 20 is provided in the abutting part 20 on the surface emitting laser 3 side. The abutting part 20, the insertion hole 15A, and the through hole 19 are formed, for example, by a drill. The outer periphery of an end face 21 of the optical fiber cable abuts on the inside of the abutting part 20 for fixation, and thus the surface emitting laser 3 and the optical fiber cable 1 can be positioned so as to be separated by a specified distance.

A cylindrical through hole 10 is provided in a substrate 2A, and light output from a light emitting unit 11 is transmitted to an optical fiber 5 via the through hole 10 and the through hole 19. A metal wiring layer 8A is provided on the substrate 2A on the surface emitting laser 3 side, and the surface emitting laser 3 is mounted with a bump 13 and adhesive 14.

Also in the second embodiment, the optical fiber cable 1 with the end face of the optical fiber 5 covered with the jacket 6 abuts on the abutting part 20 for fixation. With this structure, the optical fiber cable 1 and the surface emitting laser 3 can easily be positioned without damage to the optical fiber 5.

As described above, the optical fiber cable connecting structure according to some embodiments is useful for applications where signal transmission is performed at a high speed between an image pickup device with a large number of pixels and a signal processing device. Further, the optical fiber cable connecting structure of the present invention is particularly suitable for applications, for example, endoscopes and ultrasonic image systems (ultrasound endoscopes) where data are communicated at a high speed and a reduction in size is required.

According to some embodiments, an optical element and an optical fiber cable can easily be positioned through a substrate having a through hole, and damage to the end face of the optical fiber can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical fiber cable connecting structure, comprising:
   a substrate having a through hole;
   an optical element mounted on a first surface of the substrate and having a light receiving unit for inputting an optical signal or a light emitting unit for outputting the optical signal, the light receiving unit or the light emitting unit being provided to face the substrate;
   an optical fiber cable mounted on a second surface of the substrate opposite to the first surface on which the optical element is mounted, an end face of the optical fiber cable on a substrate side being covered with a jacket;
   a guide positioning part that has an insertion hole into which the optical fiber cable is configured to be inserted to hold the optical fiber cable, the guide positioning part being configured to position the optical fiber cable with respect to an emitting direction of light that is input and output via the through hole from the optical element; and
   an abutting part that has an opening whose cross-sectional area on an optical fiber cable side is larger than that of the end face of the optical fiber cable and is reduced either stepwise or continuously towards the optical element, the abutting part being configured to position the optical element and the optical fiber cable so as to be separated by a specified distance by fixing an outer periphery of the end face of the optical fiber cable by the opening;
   wherein the abutting part is an inner periphery of the through hole.

2. The optical fiber cable connecting structure according to claim 1, wherein the substrate comprises:
   a base member formed of a polyimide;
   a metal wiring layer provided on the base member; and
   an insulating layer formed of a resist, wherein
   the abutting part abuts on the end face of the optical fiber cable on a surface of the base member.

3. The optical fiber cable connecting structure according to claim 1, wherein the through hole has a truncated cone shape.

4. An optical fiber cable connecting structure, comprising:
   a substrate having a through hole;
   an optical element mounted on a first surface of the substrate and having a light receiving unit for inputting an optical signal or a light emitting unit for outputting the optical signal, the light receiving unit or the light emitting unit being provided to face the substrate;
   an optical fiber cable mounted on a second surface of the substrate opposite to the first surface on which the optical element is mounted, an end face of the optical fiber cable on a substrate side being covered with a jacket;
   a guide positioning part that has an insertion hole into which the optical fiber cable is configured to be inserted to hold the optical fiber cable, the guide positioning part being configured to position the optical fiber cable with respect to an emitting direction of light that is input and output via the through hole from the optical element; and
   an abutting part that has an opening whose cross-sectional area on an optical fiber cable side is larger than that of the end face of the optical fiber cable and is reduced either stepwise or continuously towards the optical element, the abutting part being configured to position the optical element and the optical fiber cable so as to be separated by a specified distance by fixing an outer periphery of the end face of the optical fiber cable by the opening;
   wherein the through hole has a truncated cone shape.

* * * * *